(12) United States Patent
Yamamoto

(10) Patent No.: US 7,341,945 B2
(45) Date of Patent: Mar. 11, 2008

(54) METHOD OF FABRICATING SEMICONDUCTOR DEVICE

(75) Inventor: Yoshiaki Yamamoto, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 106 days.

(21) Appl. No.: 10/373,454

(22) Filed: Feb. 25, 2003

(65) Prior Publication Data

US 2004/0043609 A1    Mar. 4, 2004

(30) Foreign Application Priority Data

Feb. 26, 2002    (JP) ............................. 2002-049567

(51) Int. Cl.
*H01L 21/44* (2006.01)
(52) U.S. Cl. .............. 438/687; 257/E23.161; 257/E21.575; 257/E21.586
(58) Field of Classification Search ................ 438/677, 438/687, 653, 635, 625, 629, 642, 652, 660, 438/674, 762, 763, 768
See application file for complete search history.

(56) References Cited

U.S. PATENT DOCUMENTS

| 4,789,648 | A | | 12/1988 | Chow et al. | |
|---|---|---|---|---|---|
| 4,951,601 | A | * | 8/1990 | Maydan et al. | 118/719 |
| 5,091,219 | A | * | 2/1992 | Monkowski et al. | 427/255.5 |
| 5,981,399 | A | * | 11/1999 | Kawamura et al. | 438/715 |
| 6,355,909 | B1 | * | 3/2002 | Griffiths et al. | 219/403 |
| 6,387,805 | B2 | * | 5/2002 | Ding et al. | 438/687 |
| 6,436,267 | B1 | * | 8/2002 | Carl et al. | 205/186 |
| 6,440,854 | B1 | * | 8/2002 | Rozbicki | 438/687 |
| 6,462,411 | B1 | * | 10/2002 | Watanabe et al. | 257/723 |
| 6,586,340 | B2 | * | 7/2003 | Lee et al. | 438/715 |
| 6,610,151 | B1 | * | 8/2003 | Cohen | 118/719 |
| 6,853,520 | B2 | * | 2/2005 | Fukuzawa et al. | 360/324.1 |

(Continued)

FOREIGN PATENT DOCUMENTS

JP    5-46983    7/1993

(Continued)

OTHER PUBLICATIONS

Wolf et al. Silicon Processing for the VLSI Era, vol. 1- Process Technology, 200, Lattice Press, Second edition pp. 784-78).*

(Continued)

*Primary Examiner*—Scott B. Geyer
(74) *Attorney, Agent, or Firm*—Katten Muchin Rosenman LLP

(57) ABSTRACT

A method of fabricating a semiconductor device prevents agglomeration of a seed metal layer in a recess. A recess is formed in a dielectric layer formed on or over a wafer. A seed metal layer (e.g., Cu or Cu alloy) is then formed on a bottom face and an inner side face of the recess. Subsequently, a surface of the seed metal layer is oxidized by exposing the surface of the seed metal layer to an oxygen-containing gas or the atmospheric air before agglomeration of the seed metal layer occurs, thereby forming an oxide layer in the surface of the seed metal layer. A filling metal (e.g., Cu or Cu alloy) is plated on the oxide layer of the seed metal layer while using the seed metal layer whose surface is oxidized as an electrode, thereby filling the recess with the metal.

24 Claims, 8 Drawing Sheets

U.S. PATENT DOCUMENTS

| | | | |
|---|---|---|---|
| 6,884,466 B2 * | 4/2005 | Kaloyeros et al. | 427/255.392 |
| 2001/0012667 A1 * | 8/2001 | Ma et al. | 438/287 |
| 2003/0027427 A1 * | 2/2003 | Ma et al. | 438/700 |

FOREIGN PATENT DOCUMENTS

| | | |
|---|---|---|
| JP | 2000-183160 | 6/2000 |
| JP | 2000-208627 | 7/2000 |
| JP | 2002-289559 | 10/2002 |
| TW | 396568 | 7/2000 |
| TW | 457678 | 10/2001 |

OTHER PUBLICATIONS

Japanese Office Action dated Jun. 29, 2004.
Taiwanese Office Action dated May 10, 2004.

* cited by examiner

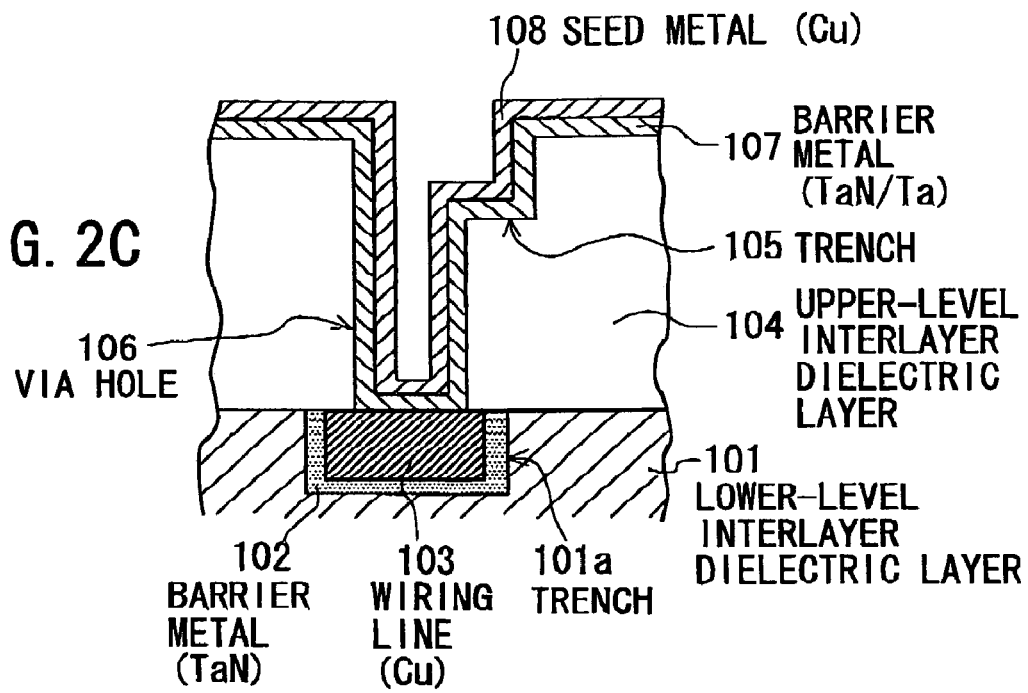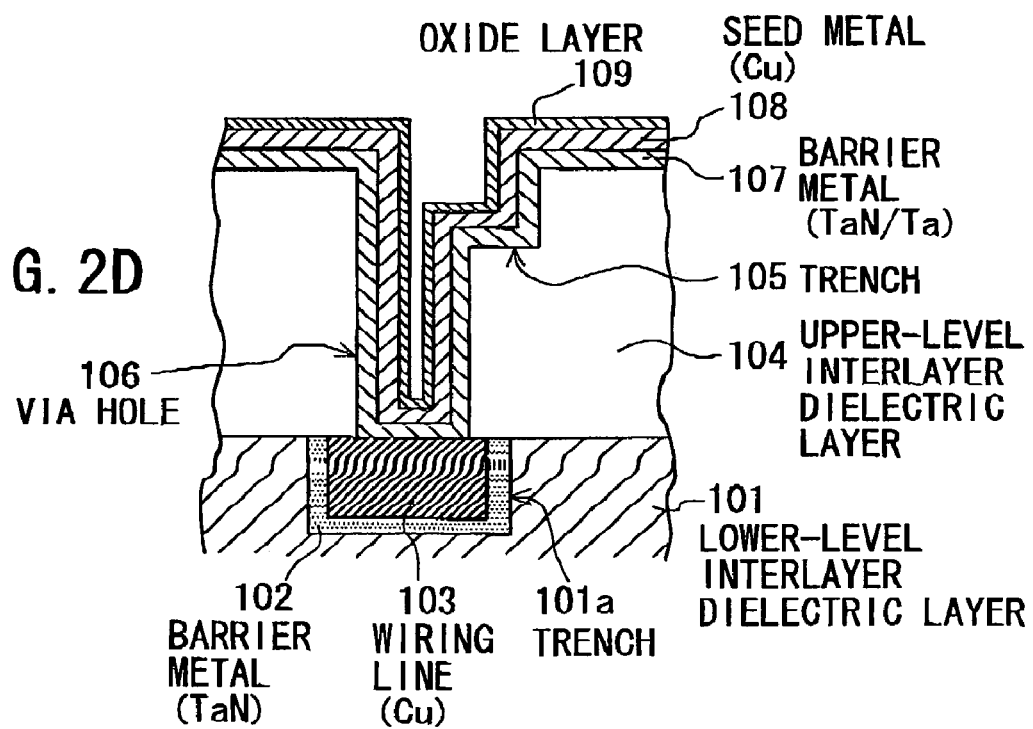

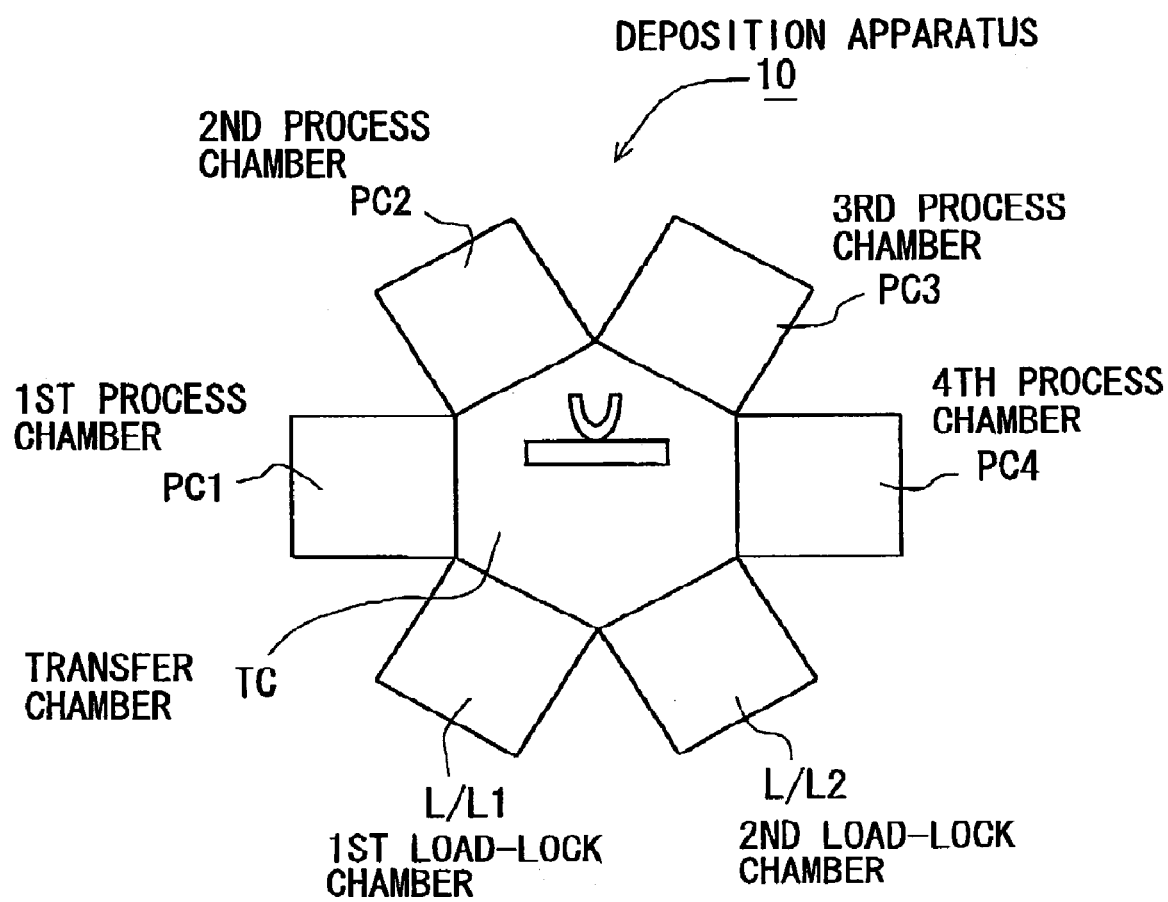

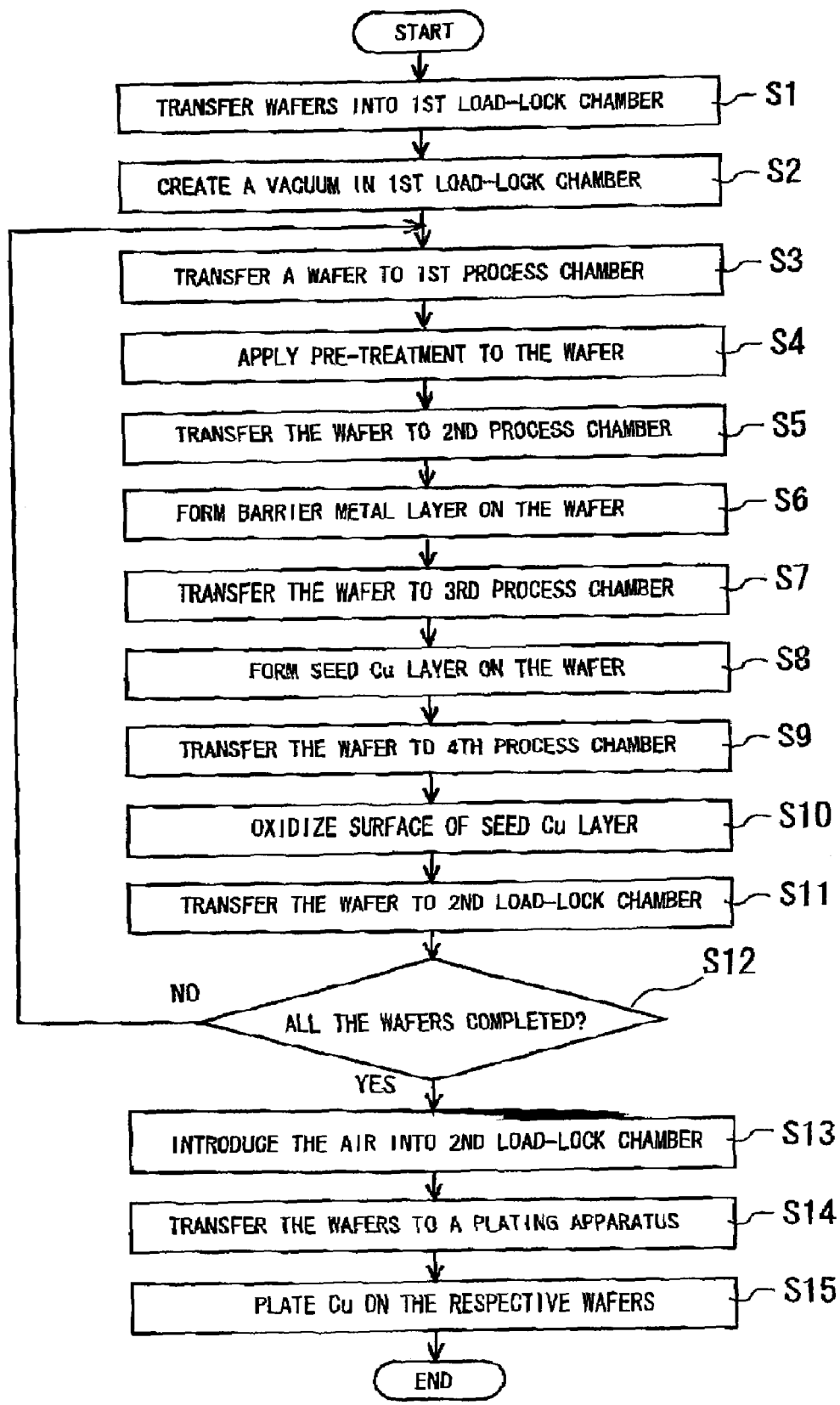

METHOD OF FABRICATING SEMICONDUCTOR DEVICE

BACKGROUND OF THE INVENTION

1. Field of the Invention

The present invention relates generally to a method of fabricating a semiconductor device. More particularly, the invention relates to a method of fabricating a semiconductor device with a metal or metals (e.g., copper) filled in a recess of a dielectric material. The invention is preferably applicable to fabrication of semiconductor devices having copper-system metal filled in a recess of a dielectric layer formed on or over a substrate or wafer.

2. Description of the Related Art

In conventional semiconductor integrated circuit devices (i.e., Ultralarge-Scale Integrated circuit devices, ULSIs), aluminum (Al) and alloys of Al (i.e., Al-system metals) have been used as the wiring metal, because Al-system metals are low in specific resistance and easy to be patterned. In recent years, however, according to the progressing demand to further increase the integration scale, miniaturization scale, operation speed, and reliability of ULSIs, the use of copper (Cu) and alloys of Cu (i.e., Cu-system metals) as the wiring metal has started and extended. This is because Cu-system metals are lower in resistivity and higher in electromigration (EM) resistance than Al-system metals.

Cu-system metals have a disadvantage that they are difficult to be patterned by dry etching. Therefore, when wiring lines are formed by a Cu-system metal, some contrivance is necessary for the patterning process. One of the contrivances of this sort, which is termed the "damascene process", is disclosed in the Japanese Examined Patent Publication No.5-46983 published in 1993, which corresponds to the U.S. Pat. No. 4,789,648 issued on Dec. 6, 1988. The "damascene process" is carried out in the following way.

Trenches (or recesses) are formed in the surface of an interlayer dielectric layer to form a wiring pattern and then, a Cu layer is deposited on the whole surface of the interlayer dielectric layer in such a way as to fill the trenches. Subsequently, the overlying part of the Cu layer with respect to the interlayer dielectric layer is selectively removed to expose the surface of the interlayer dielectric layer by the Chemical Mechanical Polishing (CMP) process, thereby selectively leaving the Cu layer in the trenches. This process is termed the "single damascene process" because only the buried wiring lines are formed through this process.

Not only trenches (or recesses) but also via holes may be formed in the surface of an interlayer dielectric layer to form a wiring pattern and via plugs. In this case, a Cu layer is then deposited on the whole surface of the interlayer dielectric layer in such a way as to fill the trenches and the via holes. Subsequently, the overlying part of the Cu layer with respect to the interlayer dielectric layer is selectively removed to expose the surface of the interlayer dielectric layer by the CMP process, thereby selectively leaving the Cu layer in the trenches and the holes. This process is termed the "dual damascene process" because both the buried wiring lines and the via plugs connected to the lines are simultaneously formed through this process. The "dual damascene process" has an advantage that the total number of necessary fabrication processes is decreased and that the fabrication cost is lowered.

To fill a Cu layer into wiring trenches (or wiring trenches and via holes), it is known that the high-temperature reflowing method, sputtering method, or electroplating method may be used. If the wiring trenches have a high aspect ratio, the electroplating method is preferred.

When a metal layer (e.g., a Cu layer) is filled into wiring trenches and via holes by the electroplating method, a seed Cu layer is formed on the inner side and bottom walls of the trenches and the holes in advance. The seed Cu layer is used as a cathode in the electroplating process. Thereafter, a Cu layer is plated in such a way as to fill the trenches and holes.

Recently, however, filling failure or defect of a Cu layer was likely to occur even if the electroplating method was used. This is because the need to reduce the wiring line width has been promoted according to the progressing miniaturization of ULSIs and as a result, the aspect ratio of wiring trenches and via holes has been raised furthermore.

For example, there is the need to fill via holes having an aspect ratio greater than four with a Cu layer. If a seed Cu layer is formed on the inner faces of a high aspect-ratio via hole of this type by the sputtering method, desired, sufficient coverage may not be obtainable. In particular, Cu is deposited on the inner side face of the via hole in such a way as to form islands in the vicinity of the bottom of the hole, resulting in a discontinuous seed Cu layer. In the area that includes the discontinuous seed Cu layer, a Cu layer will grow scarcely or insufficiently by the electroplating method. This is because the electroplating bath for the Cu layer, which is a mixture of $CuSO_4 \cdot 5H_2O$ and $H_2SO_4$, is strong acid and therefore, the dissolving rate of the discontinuous (i.e., island-shaped) seed Cu layer is larger than the growth rate of the Cu layer by plating. Accordingly, during the electroplating process, Cu grows sufficiently in the area where the seed Cu layer is continuous and at the same time, Cu grows scarcely or insufficiently in the remaining area where the seed Cu layer is discontinuous. This means that the via hole is unable to be filled with the Cu layer, resulting in unwanted voids in the hole.

To compensate the lack of the seed Cu layer, the thickness of the seed Cu layer may be increased. In this case, however, there arises a disadvantage that the seed Cu layer will be formed in such as way as to overhang outstandingly near the top of the via hole, thereby closing the top of the hole before the hole is filled with the Cu layer. This phenomenon is termed "pinch off" of the hole. If "pinch off" occurs, a large void or voids will be formed in the hole. As a result, the thickness of the seed Cu layer is unable to be increased as desired to compensate the lack of the seed Cu layer.

One of the measures or improvements to solve the above-identified problem is disclosed in the Japanese Non-Examined Patent Publication No. 2000-183160 published in Jun. 30, 2000. In this improvement, after a seed Cu layer (which is discontinuous or island-shaped) is formed, a reinforcing Cu layer is formed on the seed Cu layer by the electroless plating method, thereby eliminating the discontinuity of the seed Cu layer. Thereafter, a Cu layer is formed on the reinforcing Cu layer by the electroplating method in such a way as to fill the hole.

With the improvement disclosed in the Publication No. 2000-183160, however, there are the following disadvantages. Specifically, another plating bath is needed for the electroless plating process, which makes the plating apparatus highly complicated. Moreover, it is known that the popular electroless plating method is less in stability, reproducibility, and mass-productivity.

Another measure or improvement to solve the above-identified problem is to use the long-throw sputtering method or the ionized sputtering method. With the long-throw sputtering method, the distance between the substrate and the sputtering target is increased compared with the popular sputtering method. On the other hand, with the ionized sputtering method, sputtered Cu atoms are ionized and at the same time, a bias voltage is applied to the substrate, thereby actively introducing the ionized Cu atoms into the inside of the hole.

With the said improvement, however, the substrate temperature is raised by bombardment of the sputtered atoms or ions with the substrate and as a result, there is a disadvantage that agglomeration of the Cu layer is likely to occur.

Generally, a seed Cu layer is formed on a barrier metal layer in such a way that the energy of the seed Cu layer itself is minimized. Therefore, if a sufficient energy (e.g., due to high temperature) is applied to the seed Cu layer to cause "surface migration" of Cu atoms, agglomeration of the Cu layer will occur.

FIG. 1A is a photograph showing the state of agglomeration of the seed Cu layer in a via hole of a dielectric layer. This photograph was obtained by the inventor's test where a seed Cu layer was formed under the condition that the holder temperature was set at 80° C. As seen from FIG. 1A, the seed Cu layer was discontinuously is treated as one lot. Therefore, usually, semiconductor wafers in one lot are transferred into the process chamber of a deposition apparatus (e.g., a sputtering apparatus) and then, seed Cu layers are formed on the respective wafers in the lot. The inside of the chamber is kept in a vacuum during the deposition process. Subsequently, the wafers in the lot are transferred from the chamber of the deposition apparatus into the atmosphere and thereafter, transferred to a plating apparatus for a desired plating process. Thus, the earlier-deposited wafers in the lot are kept in the vacuum at room temperature until deposition for a seed Cu layer is completed for the remaining wafers in the same lot. Since the earlier-deposited wafers are not cooled during the waiting or holding period, the seed Cu layer is likely to be agglomerated due to "surface migration". This problem (i.e., the post-deposition agglomeration) can be overcome by cooling the earlier-deposited wafers during the waiting period. However, this measure makes it necessary to provide an additional cooling system, raising the fabrication cost of the semiconductor device. Thus, this measure is not preferred.

According to the inventor's test, the post-deposition agglomeration of a seed Cu layer is prominently observed in an area where the seed Cu layer is thin (e.g., the inner side face of a via hole with a high aspect ratio). When a Cu layer was formed by plating on the seed Cu layer where the post-deposition agglomeration had occurred, similar filling failure or defect to FIG. 1B was observed.

SUMMARY OF THE INVENTION

Accordingly, an object of the present invention is to provide a method of fabricating a semiconductor device that prevents agglomeration of a seed metal layer in a recess.

Another object of the present invention is to provide a method of fabricating a semiconductor device that prevents the formation of unwanted voids in a metal layer filled in a recess by plating.

Still another object of the present invention is to provide a method of fabricating a semiconductor device that improves the electrical characteristics of a semiconductor device and the fabrication yield thereof.

The above objects together with others not specifically mentioned will become clear to those skilled in the art from the following description.

According to a first aspect of the present invention, a method of fabricating a semiconductor device is provided. This method comprises:

forming a recess in a dielectric layer formed on or over a wafer;

forming a seed metal layer on a bottom face and an inner side face of the recess;

oxidizing a surface of the seed metal layer before agglomeration of the seed metal layer occurs; and plating a metal while using the seed metal layer whose surface is oxidized as an electrode, thereby filling the recess with the metal.

With the method according to the first aspect of the present invention, a recess is formed in a dielectric layer formed on or over a wafer and then, a seed metal layer is formed on a bottom face and an inner side face of the recess. Thereafter, a surface of the seed metal layer is oxidized before agglomeration of the seed metal layer occurs. Finally, a metal is plated while using the seed metal layer whose surface is oxidized as an electrode, thereby filling the recess with the metal.

Therefore, even if the wafer is placed in a vacuum at a room temperature after the surface of the seed metal layer is oxidized, agglomeration of the seed metal layer does not occur. This is because the surface migration of the seed metal layer is prevented due to the oxidation of the surface of the seed metal layer. Accordingly, the recess can be filled with the metal plated satisfactorily or adequately. This means that unwanted voids are not formed in the metal layer filled in the recess by plating.

Moreover, the formation of unwanted voids in the recess is effectively prevented and thus, the electrical characteristics and the fabrication yield of a semiconductor device are improved.

In a preferred embodiment of the method according to the first aspect of the invention, the oxidization of the surface of the seed metal layer is conducted by exposing the surface of the seed metal layer to an oxygen-containing gas or the atmospheric air.

According to a second aspect of the present invention, another method of fabricating a semiconductor device is provided, which uses a deposition apparatus with a first process chamber, a second process chamber, a third process chamber, and a transfer chamber. Each of the first, second, third process chambers is capable of creating a vacuum in its inside. The transfer chamber is capable of transferring a wafer among the first, second, and third process chambers in a vacuum. This method comprises:

forming a seed metal layer on a bottom face and an inner side face of a recess in the first chamber, the recess being formed in a dielectric layer formed on or over a wafer;

transferring the wafer into the second chamber from the first chamber by way of the transfer chamber;

exposing a surface of the seed metal layer to an oxygen-containing gas before agglomeration of the seed metal layer occurs in the second chamber, thereby oxidizing the surface of the seed metal layer;

transferring the wafer the surface of the seed metal layer of which has been oxidized into the third chamber from the second chamber by way of the transfer chamber;

keeping the wafer the surface of the seed metal layer of which has been oxidized in the third chamber;

transferring the wafer into the atmospheric air from the third chamber after keeping the wafer in the third chamber; and plating a metal while using the seed metal layer whose surface has been oxidized as an electrode, thereby filling the recess with the metal.

With the method according to the second aspect of the present invention, after a seed metal layer is formed on a bottom face and an inner side face of a recess in the first process chamber, the wafer is transferred into the second process chamber from the first process chamber by way of the transfer chamber. Next, a surface of the seed metal layer is exposed to an oxygen-containing gas before agglomeration of the seed metal layer occurs in the second process chamber, thereby oxidizing the surface of the seed metal layer. The wafer the surface of the seed metal layer of which has been oxidized is then transferred into the third process chamber from the second process chamber by way of the transfer chamber and kept in the third process chamber. Subsequently, the wafer is transferred into the atmospheric air from the third process chamber and a metal is plated while using the seed metal layer whose surface has been oxidized as an electrode, thereby filling the recess with the metal.

Therefore, even if the wafer is placed in the third process chamber in a vacuum at a room temperature after the surface of the seed metal layer is oxidized, agglomeration of the seed metal layer does not occur. This is because the surface migration of the seed metal layer is prevented due to the oxidation of the surface of the seed metal layer. Accordingly, the recess can be filled with the metal plated satisfactorily or adequately. This means that unwanted voids are not formed in the metal layer filled in the recess by plating.

Moreover, the formation of unwanted voids in the recess is effectively prevented and thus, the electrical characteristics and the fabrication yield of a semiconductor device are improved.

According to a third aspect of the present invention, still another method of fabricating a semiconductor device is provided, which uses a deposition apparatus with a process chamber, a load-lock chamber, and a transfer chamber. The process chamber is capable of creating a vacuum in its inside. The load-lock chamber is capable of creating a vacuum in its inside and introducing the atmospheric air thereto. The transfer chamber is capable of transferring a wafer between the process chamber and the load-lock chamber in a vacuum. This method comprises:

forming a seed metal layer on a bottom face and an inner side face of a recess in the process chamber, the recess being formed in a dielectric layer formed on or over a wafer;

transferring the wafer into the load-lock chamber from the process chamber by way of the transfer chamber;

exposing a surface of the seed metal layer to the atmospheric air in the load-lock chamber before agglomeration of the seed metal layer occurs, thereby oxidizing the surface of the seed metal layer; and plating a metal while using the seed metal layer whose surface has been oxidized as an electrode, thereby filling the recess with the metal.

With the method according to the third aspect of the present invention, after a seed metal layer is formed on a bottom face and an inner side face of a recess in the process chamber, the wafer is transferred into the load-lock chamber from the process chamber by way of the transfer chamber. Next, a surface of the seed metal layer is exposed to the atmospheric air in the load-lock chamber before agglomeration of the seed metal layer occurs, thereby oxidizing the surface of the seed metal layer. Subsequently, a metal is plated while using the seed metal layer whose surface has been oxidized as an electrode, thereby filling the recess with the metal.

Therefore, even if the wafer is placed in a vacuum at a room temperature after the surface of the seed metal layer is oxidized, agglomeration of the seed metal layer does not occur. This is because the surface migration of the seed metal layer is prevented due to the oxidation of the surface of the seed metal layer. Accordingly, the recess can be filled with the metal plated satisfactorily or adequately. This means that unwanted voids are not formed in the metal layer filled in the recess by plating.

Moreover, the formation of unwanted voids in the recess is effectively prevented and thus, the electrical characteristics and the fabrication yield of a semiconductor device are improved.

In a preferred embodiment of the methods according to the first to third aspects of the invention, the seed metal layer has a thickness of 12 nm or less in the recess.

In this embodiment, it is preferred that the oxidation of the surface of the seed metal layer is carried out in 20 minutes or less after the seed metal layer is formed.

In another preferred embodiment of the methods according to the first to thirds aspect of the invention, the seed metal layer is formed by a sputtering process.

In still another preferred embodiment of the methods according to the first to thirds aspect of the invention, the seed metal layer and the metal are Cu or an alloy of Cu.

Additionally, with the methods according to the first to third aspects of the invention, the oxide generated in the surface of the seed metal layer is dissolved into the plating solution in the plating process, thereby exposing the non-oxidized surface of the seed metal layer. Therefore, the plating process is not obstructed or badly affected by the oxide.

BRIEF DESCRIPTION OF THE DRAWINGS

In order that the present invention may be readily carried into effect, it will now be described with reference to the accompanying drawings.

FIGS. 2A to 2F are partial, schematic cross-sectional views showing the process steps of a method of fabricating a semiconductor device according to a first embodiment of the invention, respectively.

FIG. 3 is a schematic view showing the structure of a deposition apparatus used for the method of fabricating a semiconductor device according to the first embodiment of the invention.

FIG. 4 is a schematic view showing the process steps of the method of fabricating a semiconductor device according to the first embodiment of the invention.

DETAILED DESCRIPTION OF THE PREFERRED EMBODIMENTS

Figure 1A:
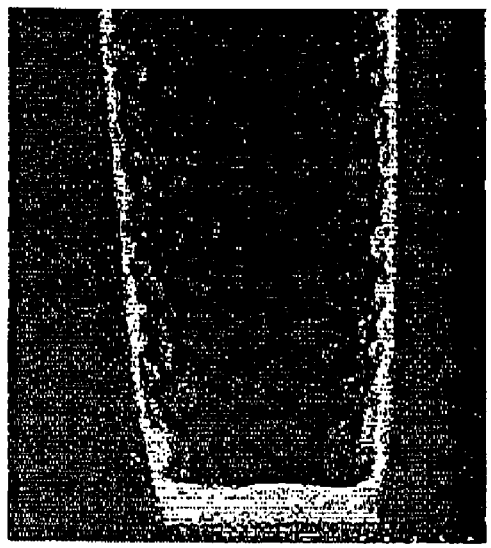
FIG. 1A is a photograph showing the state of agglomeration of a seed Cu layer in a via hole of a dielectric layer, which was formed by a prior-art method.
Figure 1B:
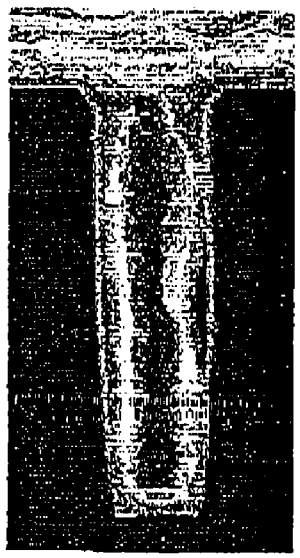
FIG. 1B is a photograph showing the filling failure or defect occurred in the hole, which was formed by the prior-art method.

Preferred embodiments of the present invention will be described in detail below while referring to the drawings attached.

First Embodiment

A method of fabricating a semiconductor device (e.g., a ULSI) according to a first embodiment of the invention is shown in FIGS. 2A to 2F. Although many trenches and many via holes are practically formed in a semiconductor device, only one trench and one via hole formed in an upper-level interlayer dielectric layer and only one trench formed in a lower-level interlayer dielectric layer are shown and explained below for the sake of simplification of description.

Figure 2A:
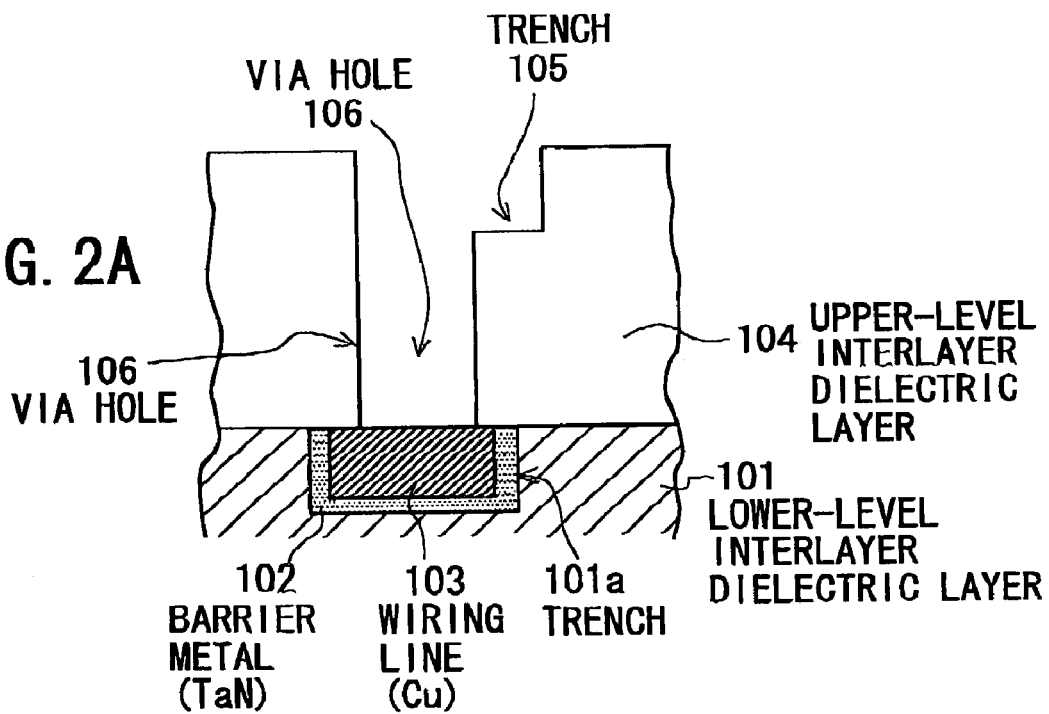

First, as shown in FIG. 2A, a trench 101a, which is used for a lower-level wiring line, is formed in a lower-level interlayer dielectric layer 101. The layer 101 is formed on or over a semiconductor wafer or substrate. A tantalum nitride (TaN) layer as a barrier metal layer 102 is formed in the trench 101a in such a way as to extend along the bottom face and the inner side faces of the trench 101a, thereby covering the bottom face and the inner side faces.

Next, a Cu layer is deposited to fill the trench 101a by a known method, thereby forming a lower-level wiring line 103 in the trench 101a. The line 103 is extended perpendicular to the paper along the surface of the layer 101.

An upper-level interlayer dielectric layer 104 is formed on the lower-level interlayer dielectric layer 101 to cover the wiring line 103. Thereafter, a wiring trench 105 and a via hole 106 are successively formed in the layer 104 by known lithography and etching processes. The hole 106 penetrates the layer 104 vertically to reach the lower-level wiring line 103. The trench 105, which does not penetrate the layer 104 vertically, is extended perpendicular to the paper along the surface of the layer 101. The hole 106 is overlapped with a part of the trench 105. The state at this stage is shown in FIG. 2A.

Subsequently, a pre-treatment is carried out for the subsequent sputtering process according to the necessity. For example, argon (Ar) plasma is generated in a vacuum and then, the upper-level interlayer dielectric layer 104 is etched by the Ar ions existing in the plasma in such a way as to be equivalent to the thickness of 10 nm of an oxide. The reducing effect or function of hydrogen ($H_2$) plasma may be used for this purpose.

Figure 2B:
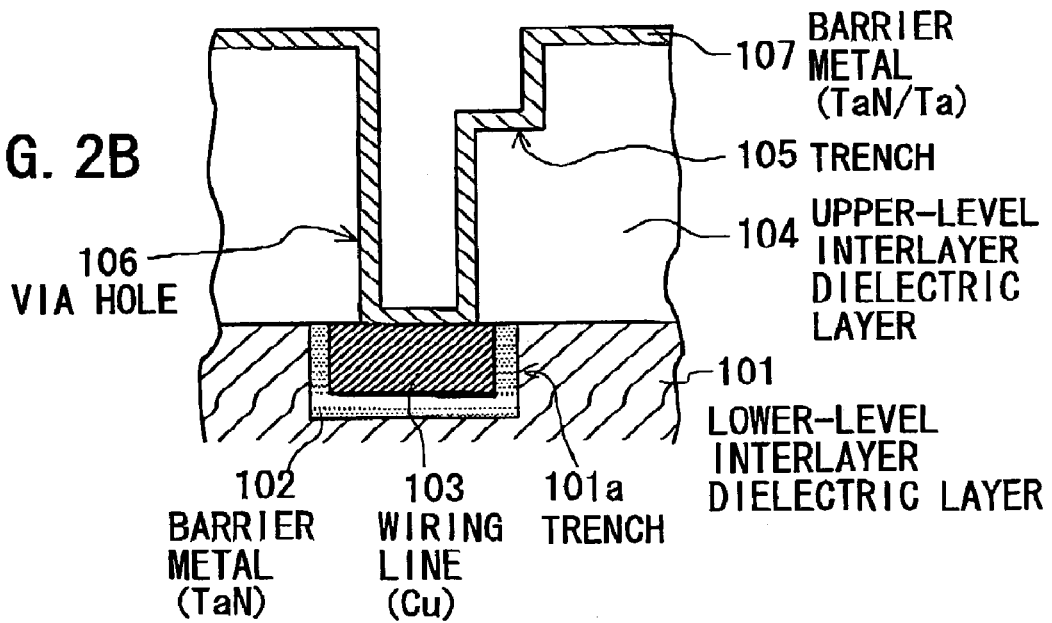
Figure 2E:
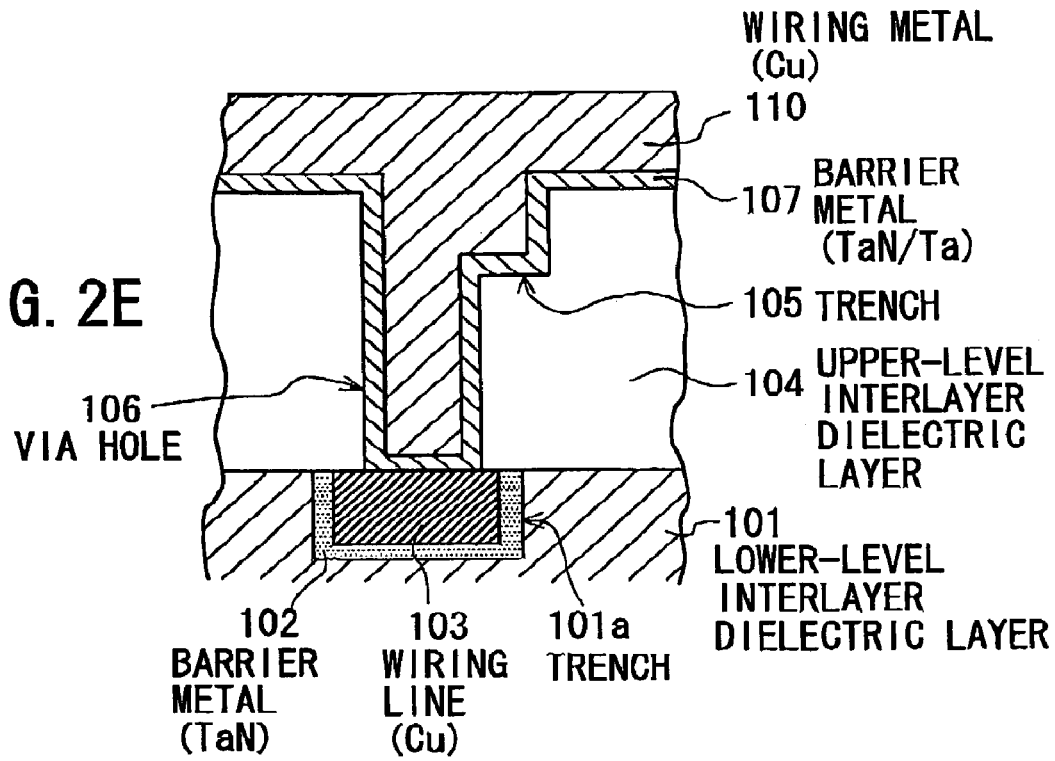

Next, as shown in FIG. 2B, a barrier metal layer 107 is formed on the upper-level interlayer dielectric layer 104 so as to cover the whole inner faces of the wiring trench 105 and the via hole 104 by a sputtering process or processes. Here, the layer 107 has a two-layer structure made of a tantalum nitride (TaN) sublayer (20 nm in thickness) and a tantalum (Ta) sublayer Ta (20 nm in thickness).

Concretely speaking, for example, a sputtering target of Ta was placed in the process chamber of a sputtering apparatus and the wafer was placed on the wafer holder thereof. The mixture of argon (Ar) and nitrogen ($N_2$) was filled into the process chamber as a process gas, where the pressure was set at 4 Pa. The DC sputtering power was set at 1 kW and the temperature of the heater built in the wafer holder (i.e., the wafer folder temperature) was set at 100° C. The TaN sublayer was first deposited and then, the supply of nitrogen gas ($N_2$) was stopped during the sputtering process. As a result, the Ta sublayer was continuously deposited on the TaN sublayer, resulting in the barrier metal layer 107 made of the TaN/Ta layer. The wafer holder temperature may be set at room temperature or a temperature below zero. It is preferred that the wafer holder temperature is set at a lower temperature. The state at this stage is shown in FIG. 2B.

Needless to say, a Chemical Vapor Deposition (CVD) or Atomic Layer Deposition (ALD) process or processes may be used for forming the barrier metal layer 107 instead of a sputtering process or processes.

On the barrier metal layer 107 of TaN/Ta, as shown in FIG. 2C, a seed Cu layer 108 is formed so as to cover the whole surface of the layer 107 by a sputtering process or processes. Here, the seed Cu layer 108 is 200 nm in thickness. The state at this stage is shown in FIG. 2C.

Concretely speaking, for example, a sputtering target of Cu was placed in the process chamber of a sputtering apparatus and the wafer was placed on the wafer holder thereof. Thereafter, the wafer was cooled and then, an argon (Ar) gas was filled into the process chamber as a process gas, where the pressure was set at 8 Pa. The DC sputtering power was set at 1 kW. The sputtering or deposition rate was set at 150 nm/min and the sputtering/deposition period was set at 80 sec. Since the via hole 106 had an aspect ratio of 4.8, the coverage of the seed Cu layer 108 was 6% on the inner side faces of the via hole 106, and the thickness of the layer 108 was 12 nm on the inner faces of the hole 106. The cooling operation of the wafer was conducted with the use of an Ar gas (i.e., a cooling medium) that had been cooled to −40° C. with a chiller. The cooling operation for the wafer was kept for 60 seconds. The wafer holder used here was a holder with an Electro-Static Chuck (ESC). However, the wafer holder may be a holder of the clamping type.

If the wafer can be cooled by the wafer holder way of direct thermal conduction, the use of the cooling medium (i.e., Ar gas) is unnecessary. Any other cooling method may by used for this purpose. A CVD process may be used for forming the seed Cu layer 108 instead of a sputtering process.

Furthermore, the wafer with the seed Cu layer 108 is exposed to an oxygen-containing gas, thereby oxidizing the surface of the layer 108. Thus, an oxide layer 109 is formed in the surface of the layer 108. This oxidation process is carried out before the agglomeration of the seed Cu layer 108 occurs. This oxidation process prevents the surface migration from occurring in the surface of the layer 108 and therefore, the agglomeration of the layer 108 is effectively avoided. The state at this stage is shown in FIG. 2D.

Table 1 presented below shows the result of observation about existence/absence of the agglomeration of the seed Cu layer 108 as a function of the "holding time" of the layer 108. The "holding time" means a time from the formation of the layer 108 to the exposure thereof to the oxygen-containing gas. In other words, the "holding time" is a time the wafer with the layer 108 is held in a vacuum in the process chamber of the sputtering apparatus.

TABLE 1

| HOLDING TIME (min) | 17 | 20 | 23 | 26 | 29 | 38 |
|---|---|---|---|---|---|---|
| AGGLOMERATION OBSERVED | NO | NO | YES | YES | YES | YES |

As described above, the thickness of the seed Cu layer 108 was 12 nm on the inner faces of the via hole 106. In this case, as seen from Table 1, when the wafer with the layer 108 was held in the process chamber for 23 minutes or longer, agglomeration was observed. The level or degree of agglomeration became worse as the holding time increased. As a result, it was found that agglomeration of the seed Cu layer 18 was prevented from occurring by exposing the layer 18 to an oxygen-containing gas within 20 minutes after the completion of deposition of the layer 18 if the seed Cu layer 108 was 12 nm or less in thickness.

Subsequently, a Cu layer as a wiring metal 110 is formed on the oxide layer 109 by a plating process, where the seed Cu layer 108 is used as the cathode. This plating process is carried out in such a way that the hollow insides of the via hole 106 and the wiring trench 105 are filled with the wiring Cu layer 110.

Concretely, the wafer with the oxide layer 109 was placed in a Cu electroplating bath (which was made of the mixture of $CuSo_4.5H_2O$ and $H_2SO_4$) and then, an electroplating process was carried out using the layer 109 as one of the plating electrodes. During the electroplating process, the oxide layer 109 that covered the surface of the seed Cu layer 108 dissolved into the electroplating bath or mixture and as a result, the non-oxidized surface of the seed Cu layer 108 was exposed. Thus, it was found that the layer 108 served as the cathode during the said electroplating process. Taking this fact into consideration, it was preferred that the thickness of the oxide layer 109 was set at approximately 1 nm to 2 nm, because agglomeration of the seed Cu layer 108 was prevented while the plating process was not obstructed.

Figure 2F:
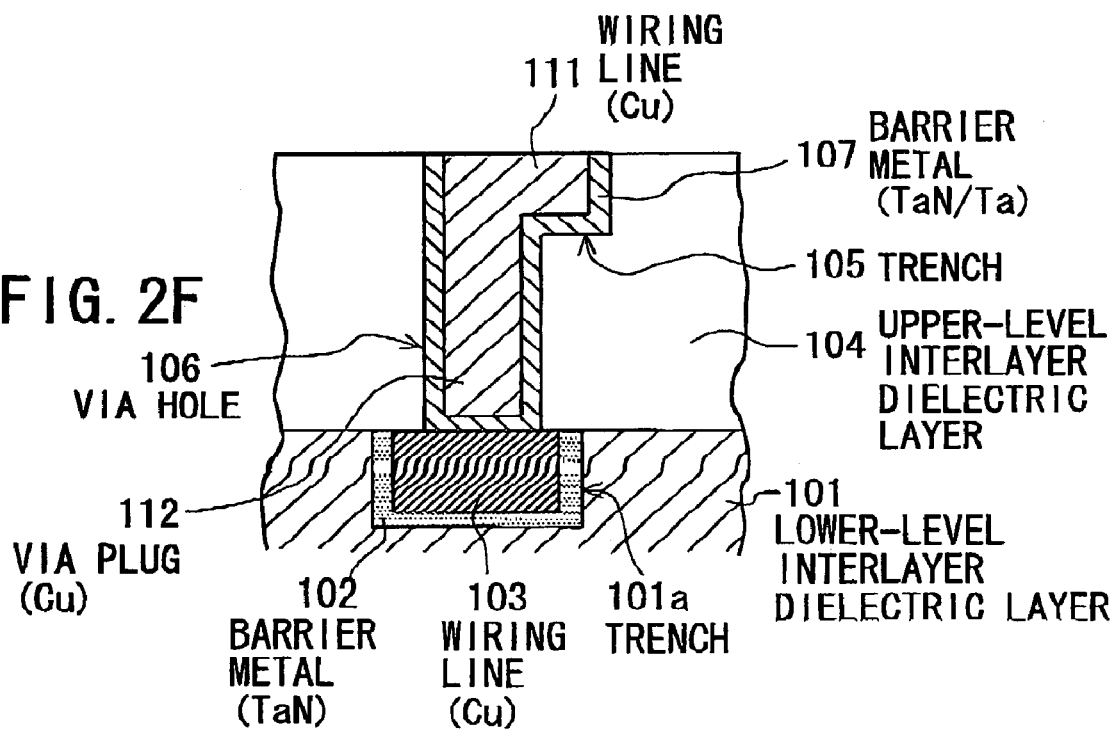

Following this step, the overlying part of the wiring Cu layer 110 and that of the barrier (TaN/Ta) layer 107 with respect to the surface of the upper-level interlayer dielectric layer 104 are selectively removed by the known CMP process. Thus, the wiring Cu layer 110 is selectively left in the via hole 106 and in the wiring trench 105 along with the barrier metal layer 107, thereby forming a wiring line 111 and a via plug 112 simultaneously. The line 111 and the plug 112 are united with each other. The state at this stage is shown in FIG. 2F. Since the wiring line 111 and the via plug 112 are simultaneously formed in the first embodiment, this CMP process is a dual damascene process.

The pre-treatment process (FIG. 2A) to the oxidation process (FIG. 2D) described above may be carried out in a layer-deposition or formation apparatus 10 as shown in FIG. 3. This apparatus 10 comprises first to fourth process chambers PC1, PC2, PC3, and PC4, a transfer chamber TC, and first and second load-lock chambers L/L1 and L/L2.

Each of the first to fourth process chambers. PC1, PC2, PC3, and PC4 is capable of creating a vacuum in its inside according to the necessity. A deposition process such as a sputtering process can be carried out in each of these chambers PC1 to PC4.

The transfer chamber TC is capable of transferring a wafer among the first to fourth process chambers PC1, PC2, PC3, and PC4 in a vacuum. The chamber TC is used to carry a wafer into any one of these chambers PC1 to PC4 and/or to carry a wafer out of the same.

Each of the first and second load-lock chambers L/L1 and L/L2 is capable of creating a vacuum in its inside and introducing the atmospheric air thereto. Each of the chambers L/L1 and L/L2 is used to carry a wafer into the apparatus 10 and to carry a wafer out of the same.

The execution of the above-described pre-treatment process (FIG. 2A) to the oxidation process (FIG. 2D) using the apparatus 10 is explained below with reference to FIG. 4.

First, a plurality of wafers to be processed in one lot are successively carried into the first load-lock chamber L/L1 (step S1). Each of the said wafers has the wiring trench 105 and the via hole 106 in the upper-level interlayer dielectric layer 104. Here, 25 wafers are contained in the lot. Thus, 25 wafers in the lot are successively carried into the chamber L/L1 and then, the inside air of the chamber L/L1 is evacuated to create a desired vacuum in the chamber L/L1 (step S2).

Next, the first one of the wafers to be processed is transferred from the first load-lock chamber L/L1 to the first process chamber PC1 by way of the transfer chamber TC (step S3). In the first process chamber PC1, the pre-treatment for the subsequent sputtering process is conducted (step S4). Thereafter, the first wafer is transferred from the first process chamber PC1 to the second process chamber PC2 by way of the transfer chamber TC (step S5). In the second process chamber PC2, the sputtering process is conducted to form the barrier metal layer 107 made of TaN/Ta (step S6). Furthermore, the first wafer is transferred from the second process chamber PC2 to the third process chamber PC3 by way of the transfer chamber TC (step S7). In the third process chamber PC3, the sputtering process is conducted to form the seed Cu layer 108 (step S8). The first wafer is then transferred from the third process chamber PC3 to the fourth process chamber PC4 by way of the transfer chamber TC (step S9). In the fourth process chamber PC4, the oxidation process is conducted to form the oxide layer 109 in the surface of the seed Cu layer 108 (step S10).

Finally, the first wafer is transferred from the fourth process chamber PC4 to the second d load-lock chamber L/L2 by way of the transfer chamber TC (step S11). Prior to this time, the inside air of the chamber L/L2 has been evacuated to create a desired vacuum in the chamber L/L2 at room temperature. Thus, the first wafer the necessary processes of which have been completed is held in a vacuum at room temperature in the chamber L/L2 until the necessary processes are completed to every wafer in the lot (i.e., the first to 25th wafers).

In the step S11, it is judged whether all the wafers in the lot are completed or not. Now, the result of this judgment is "NO" and therefore, the flow is returned to the step S3 and the steps S3 to S12 are conducted again.

Specifically, the second one of the 25 wafers in the lot is transferred from the first load-lock chamber L/L1 to the first process chamber PC1 by way of the transfer chamber TC (step S3) and then, the pre-treatment for the subsequent sputtering process is conducted (step S4). Thereafter, the second wafer is transferred from the first process chamber PC1 to the second process chamber PC2 by way of the transfer chamber TC (step S5), where the sputtering process is conducted to form the barrier metal layer 107 made of TaN/Ta (step S6). The second wafer is transferred from the second process chamber PC2 to the third process chamber PC3 by way of the transfer chamber TC (step S7), where the sputtering process is conducted to form the seed Cu layer 108 (step S8). The second wafer is then transferred from the third process chamber PC3 to the fourth process chamber PC4 by way of the transfer chamber TC (step S9), where the oxidation process is conducted to form the oxide layer 109 in the surface of the seed Cu layer 108 (step S10). Finally, the second wafer is transferred from the fourth process chamber PC4 to the second load-lock chamber L/L2 by way of the transfer chamber TC (step S11) and held therein.

Similarly, when the above-described flow for the 25th wafer is completed, the result of this judgment in the step S12 is "YES". Therefore, the flow is advanced to the step S13. In the step S13, the atmospheric air is introduced into the second load-lock chamber L/L2, where 25 processed wafers are held in a vacuum. Then, all the wafers in the lot are transferred in a lump from the chamber L/L2 to the outside of the apparatus 10 (step S14).

Subsequently, the plating process for forming the wiring metal layer 110 of Cu is conducted using a plating apparatus (not shown) (step S15). Thereafter, the above-described CMP process is conducted to selectively remove the layer 110, resulting in the structure of FIG. 2F.

With the deposition apparatus 10 having the above-described structure, as explained above, the wafer on which the seed Cu layer 108 has been formed in the third process chamber PC3 can be transferred to the fourth process chamber PC4 by way of the transfer chamber TC within a short period of time (e.g., within 20 minutes) for conducting the oxidation process of the layer 108. Therefore, agglomeration of the seed Cu layer 108 is effectively prevented due to the oxide layer 109, even if the wafers that are contained in the lot and that have processed earlier are left in a vacuum at room temperature in the second load-lock chamber L/L2 until the necessary processes for the remaining wafers in the same lot are completed.

Accordingly, the wiring trench 105 and the via hole 106 can be filled with the plated wiring metal (i.e., the Cu layer 110) satisfactorily or adequately. This means that unwanted voids are not formed in the Cu layer 110 (i.e., the wiring line 111 and the via plug 112) filled in the trench 105 and the hole 106.

Moreover, the formation of unwanted voids in the trench 105 and the hole 106 is effectively prevented and thus, the electrical characteristics and the fabrication yield of a semiconductor device are improved.

Figure 6A:
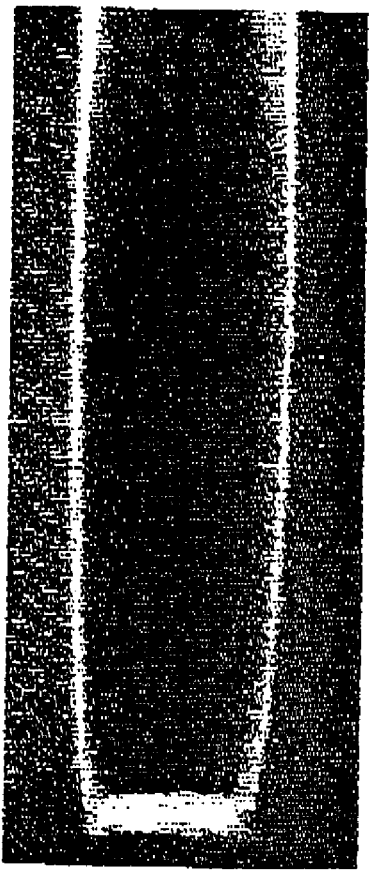
FIG. 6A is a photograph showing the partial cross section of a seed Cu layer formed in a via hole of a dielectric layer, which was formed by the method of the first embodiment of the invention.
Figure 6B:
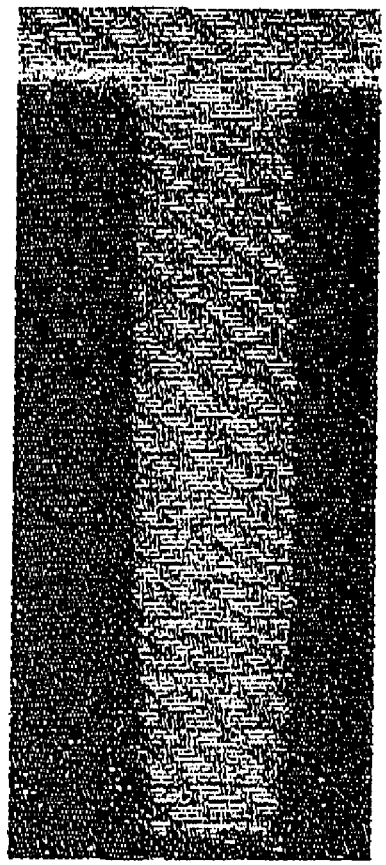
FIG. 6B is a photograph showing the cross section of a via hole of a dielectric layer formed by the method of the first embodiment of the invention, in which the hole was filled with Cu.

FIG. 6A is a photograph showing the partial cross section of the seed Cu layer 108 formed in the via hole 106, and FIG. 6B is a photograph showing the cross section of the hole 106, which were obtained by the method of the first embodiment of the invention. In this example, the surface of the seed Cu layer 108 was oxidized within 20 minutes from the formation or deposition of the layer 108 and therefore, no agglomeration was observed in the seed layer 108, as shown in FIG. 6A.

Moreover, since the plating process for the wiring metal layer 110 was carried out using the said seed layer 108, no void was seen in the via plug 112 in the hole 106, in other words, void-free, high-level filling property was obtainable.

Second Embodiment

With the above-described method of fabricating a semiconductor device according to the first embodiment, the process of transferring the wafer from the third process chamber PC3 to the fourth process chamber PC4 is necessary to expose the surface of the seed Cu layer 108 on the said wafer to the oxygen-containing gas. Unlike this, with a method of fabricating a semiconductor device according to a second embodiment of the invention, agglomeration of the seed Cu layer 108 is prevented without adding any process.

The fabrication process sequence of the method of the second embodiment is the same as that of the first embodiment shown in FIG. 2A to FIG. 2F. However, the process of forming the oxide layer 109 in the second embodiment is different from that of the first embodiment. Specifically, in the second embodiment, the oxide layer 109 is generated by exposing the seed Cu layer 108 to the atmospheric air, not to expose it to the oxygen-containing gas.

The pre-treatment process (FIG. 2A) to the oxidation process (FIG. 2D) described above may be carried out in the layer-deposition/formation apparatus 10 shown in FIG. 3. However, the apparatus 10 used for the method of the second embodiment is different from that for the first embodiment in that each of the first and second load-lock chambers L/L1 and L/L2 is capable of creating a vacuum in its inside and introducing the atmospheric air thereto for each wafer.

Figure 5:
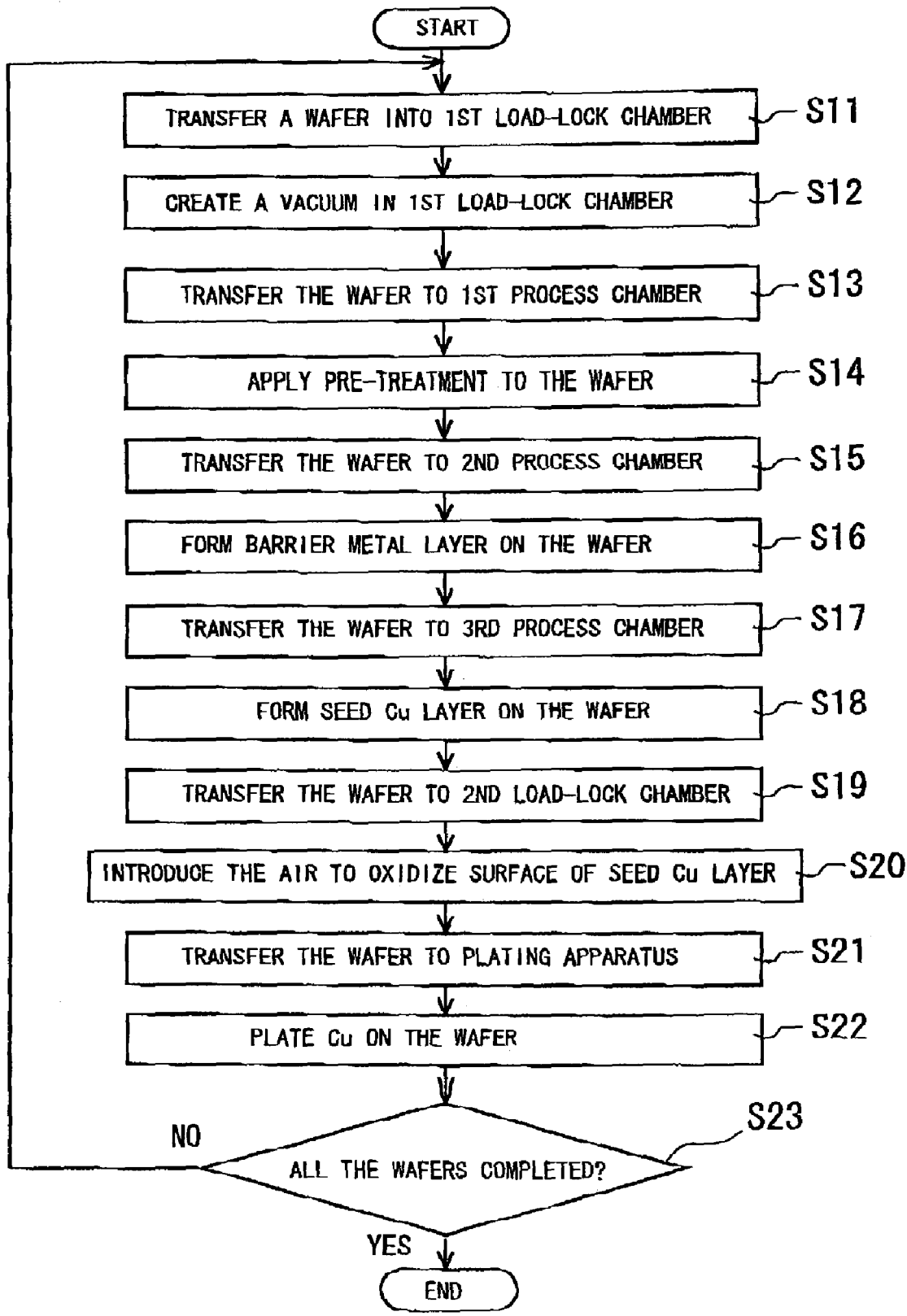
FIG. 5 is a schematic view showing the process steps of the method of fabricating a semiconductor device according to a second embodiment of the invention.

The execution of the above-described pre-treatment process (FIG. 2A) to the oxidation process (FIG. 2D) using the apparatus 10 is explained below with reference to FIG. 5.

First, a wafer (i.e., the first wafer) to be processed is carried into the first load-lock chamber L/L1 (step S11). The wafer has the wiring trench 105 and the via hole 106 in the upper-level interlayer dielectric layer 104. The inside air of the chamber L/L1 is then evacuated to create a desired vacuum in the chamber L/L1 (step S12).

Next, the wafer is transferred from the first load-lock chamber L/L1 to the first process chamber PC1 by way of the transfer chamber TC (step S13). In the first process chamber PC1, the pre-treatment for the subsequent sputtering process is conducted (step S14). Thereafter, the wafer is transferred from the first process chamber PC1 to the second process chamber PC2 by way of the transfer chamber TC (step S15). In the second process chamber PC2, the sputtering process is conducted to form the barrier metal layer 107 made of TaN/Ta (step S16). Furthermore, the wafer is transferred from the second process chamber PC2 to the third process chamber PC3 by way of the transfer chamber TC (step S17). In the third process chamber PC3, the sputtering process is conducted to form the seed Cu layer 108 (step S18).

Here, unlike the first embodiment, the wafer is transferred from the third process chamber PC3 to the second load-lock chamber L/L2 by way of the transfer chamber TC (step S19). Prior to this time, the inside air of the chamber L/L2 has been evacuated to create a desired vacuum in the chamber L/L2 at room temperature. Thus, the wafer is temporarily placed in a vacuum at room temperature in the chamber L/L2. Thereafter, the atmospheric air is introduced into the chamber L/L2 to expose the surface of the seed Cu layer 108 in the chamber L/L2 before agglomeration of the layer 108 occurs. The introduction of the air is carried out in a short period of time (e.g., within 20 minutes) from the transfer of the wafer into the chamber L/L2. As a result, the surface of the layer 108 is oxidized (i.e., the oxidation process is conducted) by the atmospheric air to thereby form the oxide layer 109 in the surface of the seed Cu layer 108 (step S20).

Subsequently, the wafer is transferred from the air-introduced chamber L/L2 to the outside of the apparatus 10 (step S21). The electroplating process for forming the wiring metal layer 110 of Cu is conducted using a plating apparatus (not shown) (step S22). Thereafter, the above-described CMP process is conducted to selectively remove the layer 110, resulting in the structure of FIG. 2F.

In the step S23, it is judged whether all the wafers in the lot are completed or not. Now, the result of this judgment is "NO" and therefore, the flow is returned to the step S11 and the steps S11 to S22 are conducted again for each of the second and subsequent wafers.

When the above-described flow for the last (e.g., 25th wafer in the lot is completed, the result of this judgment in the step S23 is "YES", resulting in the end of the flow.

With the deposition apparatus 10 having the above-described structure, as explained above, each wafer on which the seed Cu layer 108 has been formed in the third process chamber PC3 can be transferred to the second load-lock chamber L/L2 by way of the transfer chamber TC, and the layer 108 is exposed to the atmospheric air within a short period of time (e.g., within 20 minutes) for conducting the oxidation process of the layer 108. Therefore, agglomeration of the seed Cu layer 108 is effectively prevented due to the oxide layer 109.

Accordingly, the wiring trench 105 and the via hole 106 can be filled with the plated wiring metal (i.e., the Cu layer 110) satisfactorily or adequately. This means that unwanted voids are not formed in the Cu layer 110 (i.e., the wiring line 111 and the via plug 112) filled in the trench 105 and the hole 106.

Moreover, the formation of unwanted voids in the trench 105 and the hole 106 is effectively prevented and thus, the electrical characteristics and the fabrication yield of a semiconductor device are improved.

Furthermore, the oxide layer 109 is generated by simply exposing the seed Cu layer 108 to the atmospheric air in the second load-lock chamber L/L2, not to expose it to the oxygen-containing gas. Therefore, there is an additional advantage that the count of the necessary steps is decreased compared with the method of the first embodiment, in other words, no additional step is necessary for oxidizing the layer 108.

In addition, in the above-described method of the second embodiment, the oxidation of the layer 108 of the wafer is processed with the second load-lock chamber L/L2 one by one. However, the invention is not limited to this. Two or more wafers may be processed with the second load-lock chamber L/L2 at a time.

Specifically, in this case, each of the first and second load-lock chambers L/L1 and L/L2 is designed to create a vacuum in its inside and to introduce the atmospheric air thereto for two or more wafers at a time. The wafers are successively transferred from the third process chamber PC3 to the second load-lock chamber L/L2 by way of the transfer chamber TC. These wafers are temporarily placed in a vacuum at room temperature in the chamber L/L2. Thereafter, the atmospheric air is introduced into the chamber L/L2 to simultaneously expose the surfaces of the seed Cu layers 108 on the wafers thus introduced in the chamber L/L2 before agglomeration of the layers 108 occurs.

However, if the count of the wafers to be exposed to the atmospheric air in the chamber L/L2 is too large, agglomeration is likely to occur in the seed Cu layers 108 on the wafers that have processed earlier. This means that the count of the wafers is unable to be so large. As a result, the count of the wafers to be exposed to the atmospheric air in the chamber L/L2 is preferably set at a number within the maximum processible range of the apparatus 10 before the occurrence of agglomeration on the first-processed wafer, while the sputtering condition (e.g., thickness, sputtering rate, cooling time) is taken into consideration. Approximately one to five wafers were preferred under the above-identified sputtering condition in the second embodiment.

VARIATIONS

Needless to say, the present invention is not limited to the above-described first and second embodiments, because they are preferred examples of the invention. Any change or modification may be added to them within the spirit of the invention.

For example, in the above-described embodiments, the thickness of the seed Cu layer 108 is 12 nm on the inner faces of the via hole 106. However, this thickness is properly changeable according to the size and/or aspect ratio of the hole 106. According to the thickness of the seed layer 108 on the inner faces of the via hole 106, the "holding time" of the seed layer 108 is properly changeable as well.

Moreover, the seed metal and the wiring or filling metal are Cu in the above-described embodiments. However, the invention is not limited to Cu. Any alloy of Cu or other metal or alloy may be used for this purpose.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device, comprising:
    forming a recess in a dielectric layer formed on or over a wafer;
    forming a Cu seed layer, on a bottom face and an inner side face of the recess;
    oxidizing a surface of the Cu seed layer to form an oxide layer before agglomeration of the Cu seed layer occurs, thereby covering the Cu seed layer with the oxide layer, the oxidation of the surface of the Cu seed layer preventing agglomeration of the Cu seed layer; and
    plating a metal while using the Cu seed layer covered with the oxide layer as an electrode, thereby filling the recess with the metal,
    wherein the oxidizing of the surface of the Cu seed layer is conducted within 20 minutes after the Cu seed layer is formed.

2. The method according to claim 1, wherein the oxidation of the surface of the Cu seed layer is conducted by exposing the surface of the Cu seed layer to an oxygen-containing gas.

3. The method according to claim 1, wherein the oxidation of the surface of the Cu seed layer is conducted by exposing the surface of the Cu seed layer to atmospheric air.

4. The method according to claim 1, wherein the Cu seed layer is formed by sputtering.

5. The method according to claim 1, wherein the metal filled into the recess by plating is made of copper or an alloy of copper.

6. The method according to claim 1, wherein agglomeration of the Cu seed layer is prevented by covering the surface of the Cu seed layer with the oxide layer.

7. The method according to claim 1, wherein the seed metal layer has a thickness of 12 nm or less on the inner side face of the recess.

8. The method according to claim 7, wherein the Cu seed layer is formed without nitrogen, and the Cu seed layer consisting only of the seed metal.

9. A method of fabricating a semiconductor device, which uses a deposition apparatus with a first process chamber, a second process chamber, a third process chamber, and a transfer chamber;
    each of the first, second and third process chambers being capable of creating a vacuum in its inside;
    the transfer chamber being capable of transferring a wafer among the first, second, and third process chambers in a vacuum;
    forming a Cu seed layer on a bottom face and an inner side face of a recess in the first chamber, the recess being formed in a dielectric layer formed on or over a wafer;
    transferring the wafer into the second chamber from the first chamber by the way of the transfer chamber;
    exposing a surface of the Cu seed layer to an oxygen-containing gas before agglomeration of the Cu seed layer occurs in the second chamber, thereby oxidizing the surface of the Cu seed layer to form an oxide layer;

transferring the wafer with the surface of the Cu seed layer which has been covered with the oxide into the third chamber from the second chamber by way of the transfer chamber;

keeping the wafer with the surface of the Cu seed layer which has been covered with the oxide layer in the third chamber;

transferring the wafer into atmospheric air from the third chamber after keeping the wafer in the third chamber; and plating a metal while using the seed metal layer whose surface has been oxidized as an electrode, thereby filling the recess with the metal, wherein the oxidizing of the surface of the Cu seed layer is conducted within 20 minutes after the seed metal layer is formed.

10. The method according to claim 9, wherein the Cu seed layer is formed by sputtering.

11. The method according to claim 10, wherein the metal filled into the recess by plating is made of copper or an alloy of copper.

12. The method according to claim 9, wherein the seed metal layer has a thickness of 12 nm or less on the inner side face of the recess.

13. The method according to claim 12, wherein the Cu seed layer is formed without nitrogen, and the Cu seed layer consisting only of the seed metal.

14. A method of fabricating a semiconductor device, which uses a deposition apparatus with a process chamber, a load-lock chamber, and a transfer chamber;

the process chamber being capable of creating a vacuum in its inside;

the load-lock chamber being capable of creating a vacuum in its inside and introducing atmospheric air thereto;

the transfer chamber being capable of transferring a wafer between the process chamber and the load-lock chamber in a vacuum;

the method comprising:

forming a Cu seed layer on a bottom face and an inner side face of a recess in the process chamber, the recess being formed in a dielectric layer formed on or over a wafer;

transferring the wafer into the load-lock chamber from the process chamber by way of the transfer chamber;

exposing a surface of the Cu seed layer to the atmospheric air in the load-lock chamber before agglomeration of the Cu seed layer occurs, thereby oxidizing the surface of the Cu seed layer to form an oxide layer; and plating a metal while using the seed metal layer which has been covered with the oxide layer as an electrode, thereby filling the recess with the metal, wherein the oxidizing of the surface of the Cu seed layer is conducted within 20 minutes after the Cu seed layer is formed.

15. The method according to claim 14, wherein the Cu seed layer is formed by sputtering.

16. The method according to claim 14, wherein the metal filled into the recess by plating is made of copper or an alloy of copper.

17. The method according to claim 14, wherein the seed metal layer has a thickness of 12 nm or less on the inner side face of the recess.

18. The method according to claim 17, wherein the Cu seed layer is formed without nitrogen, and the Cu seed layer consisting only of the seed metal.

19. A method of fabricating a semiconductor device, which uses a deposition apparatus with a process chamber, a load-lock chamber, and a transfer chamber;

the process chamber being capable of creating a vacuum in its inside;

the load-lock chamber being capable of creating a vacuum in its inside and introducing atmospheric air thereto;

the transfer chamber being capable of transferring a wafer between the process chamber and the load-lock chamber in a vacuum;

the method comprising:

forming a Cu seed layer on a bottom face and an inner side face of a recess in the process chamber, the recess being formed in a dielectric layer formed on or over a wafer;

transferring the wafer into the load-lock chamber from the process chamber by way of the transfer chamber;

exposing a surface of the Cu seed layer to the atmospheric air in the load-lock chamber before agglomeration of the Cu seed layer occurs, thereby oxidizing the surface of the Cu seed layer to form an oxide layer; and plating a metal while using the seed metal layer which has been covered with the oxide layer as an electrode, thereby filling the recess with the metal, wherein the step of exposing a surface of the Cu seed layer to the atmospheric air in the load-lock chamber before agglomeration of the Cu seed layer occurs is performed on at most five wafers in the load-lock chamber.

20. The method according to claim 19, wherein the seed metal layer has a thickness of 12 nm or less on the inner side face of the recess.

21. The method according to claim 20, wherein the Cu seed layer is formed without nitrogen, and the Cu seed layer consisting only of the seed metal.

22. A method of fabricating a semiconductor device, which uses a deposition apparatus with a process chamber, a load-lock chamber, and a transfer chamber;

the process chamber being capable of creating a vacuum in its inside;

the load-lock chamber being capable of creating a vacuum in its inside and introducing atmospheric air thereto;

the transfer chamber being capable of transferring a wafer between the process chamber and the load-lock chamber in a vacuum;

the method comprising:

forming a Cu seed layer on a bottom face and an inner side face of a recess in the process chamber, the recess being formed in a dielectric layer formed on or over a wafer;

transferring the wafer into the load-lock chamber from the process chamber by the way of the transfer chamber;

exposing a surface of the Cu seed layer to the atmospheric air in the load-lock chamber before agglomeration of the Cu seed layer occurs, thereby oxidizing the surface of the Cu seed layer to form an oxide layer; and plating a metal while using the seed metal layer which has been covered with the oxide layer as an electrode, thereby filling the recess with the metal, wherein the exposing of the surface of the Cu seed layer to the atmospheric air is conducted after the formation of the Cu seed layer is completed for at most five of the wafers.

23. The method according to claim 22, wherein the seed metal layer has a thickness of 12 nm or less on the inner side face of the recess.

24. The method according to claim 23, wherein the Cu seed layer is formed without nitrogen, and the Cu seed layer consisting only of the seed metal.

* * * * *